United States Patent [19]

O'Leary et al.

[11] Patent Number: 5,103,122
[45] Date of Patent: Apr. 7, 1992

[54] HIGH SPEED LOW POWER DC OFFSETTING CIRCUIT

[75] Inventors: Mark O'Leary, Torrance; Paul A. Levin, Manhattan Beach, both of Calif.

[73] Assignee: Amoco Corporation, Chicago, Ill.

[21] Appl. No.: 570,609

[22] Filed: Aug. 21, 1990

[51] Int. Cl.⁵ .......................... G06G 7/10; G06G 7/12
[52] U.S. Cl. ....................... 307/491; 330/9; 307/498; 307/494
[58] Field of Search .......... 307/491, 494, 498, 296.1; 330/149, 259, 69, 9; 328/159

[56] References Cited

U.S. PATENT DOCUMENTS

| | | | |
|---|---|---|---|
| 3,936,759 | 2/1976 | Macheel | 307/491 |
| 4,229,703 | 10/1980 | Bustin | 330/9 |
| 4,323,798 | 4/1982 | Watkins | 307/491 |
| 4,417,160 | 11/1983 | Schade, Jr. | 307/491 |
| 4,810,973 | 3/1989 | Kurz | 330/9 |
| 4,857,860 | 8/1989 | Sevastopoulos | 330/9 |
| 4,933,643 | 6/1990 | Jandu et al. | 330/9 |

*Primary Examiner*—Edward P. Westin
*Assistant Examiner*—Richard Roseen
*Attorney, Agent, or Firm*—James A. Gabala; William H. Magidson; Ralph C. Medhurst

[57] ABSTRACT

A high speed, low power DC-offsetting circuit, comprising: an amplifier having an inverting input, a non-inverting input which is adapted to be connected to a high speed low DC voltage source and having an output; a current source which is connected to said inverting input and through a bypass resistor to said output; and capacitor means and resistor means, connected in series with each other at an output node, for connecting said non-inverting input to said output.

21 Claims, 3 Drawing Sheets

HIGH SPEED LOW POWER DC OFFSETTING CIRCUIT

TECHNICAL FIELD

This invention relates to the general subject of electronic circuits and, in particular, to the subject of amplifier circuits used to sum a high speed, DC coupled signal and a low speed high level DC coupled signal.

BACKGROUND OF THE INVENTION

Amplifier design is a study in compromise. Often a single device can't achieve optimal speed, drift, bias-current, noise, and output-power specs. Although various devices emphasizing one or more of these areas have evolved, those skilled in the art often find that the required performance can only be obtained with a dedicated amplifier design. Moreover, if a single device can't provide the desired characteristics (high speed and DC precision, for example), those skilled in the art can often configure a composite amplifier to do the job. Composite designs combine the best features of two or more amplifiers to achieve a level of performance unobtainable in a single device. Williams, "Composite Amplifiers Yield High Speed and Low Offset", EDN, Jan. 22, 1987.

One frequently occurring problem is that of DC coupling signals, such as in FM modulators and phase-locked loops. Heretofore, at least three techniques have been used. One technique is based on floating the power supplies of wideband, DC-coupled amplifiers so as to overcome their limited offset voltage range. Another technique is based on summing a high-speed, low level signal with a low-speed, high level signal by converting the former to a current, and dropping this current across a resistor, one end of which is connected to the high level signal. Still another technique is to conventionally sum the signals with a summing amplifier of combined high frequency capability.

Clearly a single amplifier design is preferred to a composite design. Not only are the number of parts reduced but often the size is reduced. Single component designs also offer the potential for reduced costs due to economies of scale. Since the problem of DC-coupling a high speed signal and a low speed signal has applicability to the transmission of video information, a single amplifier design would have great utility to the industry.

SUMMARY OF THE INVENTION

One object of the present invention is to disclose a circuit for summing a high speed DC-coupled signal with a low speed high level DC-coupled signal.

Another object of the invention is to disclose an improved low power summing circuit having a high voltage range and a wide frequency response.

Yet another object of the invention is to disclose a circuit which allows one to use a low power, limited voltage range video amplifier in conjunction with low power, low frequency, high voltage range capable components to achieve a net power and complexity decrease.

Still another object of the invention is to disclose a circuit for combining a low-speed, high DC level signal with a high-speed, low DC signal to produce an output signal having the dc range of low speed circuitry and the frequency response of high speed circuitry.

Another object of the invention is to provide a low cost, cool running summing circuit.

In accordance with the present invention a high speed, low power DC-offsetting circuit is disclosed. The circuit comprises: an amplifier having an inverting input, a non-inverting input which is adapted to be connected to a high speed low DC voltage source and having an amplifier output; a current source which is connected to said inverting input and through a feedback resistor to said amplifier output; and capacitor means and resistor means, connected in series with each other at a circuit output node, for connecting said non-inverting input to said amplifier output.

The high-speed low power DC offset circuit adds a DC and low frequency signal to a high speed dc-coupled one. The circuit uses an amplifier in a unity or low gain connection to accomplish this. One unique feature is that the high speed signal passes through two paths to the output, one of which carries DC to some moderate break frequency, while the other carries frequencies from the break frequency to an upper limit which can be made arbitrarily high through appropriate component selection. These two paths cross over such that the frequency magnitude response and group delay are essentially flat from DC to the upper limit imposed externally of the offset circuit.

Some of the advantages of the disclosed circuit design include its simplicity, and its small size. Numerous other advantages and features of the present invention will become readily apparent from the following detailed description of the invention, the embodiment described therein, from the claims, and from the accompanying drawings.

DETAILED DESCRIPTION

Figure 1:
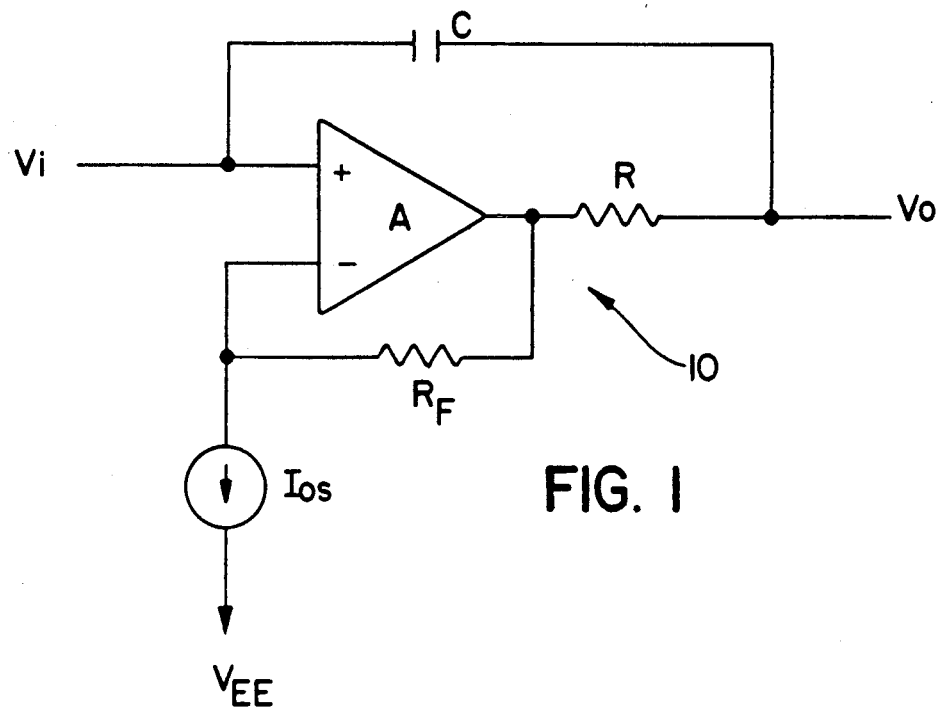
FIG. 1 is an electrical schematic diagram of the circuit that is the subject of the present invention.

While this invention is susceptible of embodiment in many different forms, there is shown in the drawings and will herein be described in detail several specific embodiments of the invention. It should be understood, however, that the present disclosure is to be considered an exemplification of the principles of the invention and is not intended to limit the invention to any illustrated specific embodiment.

One unique feature of the invention is that it allows one to combine a low-speed, high DC level signal with a high-speed low DC signal to produce a signal with DC range of low speed circuitry and the frequency response of high speed circuitry. This combining occurs with a frequency crossover effect which adds no distortion.

Figure 2:
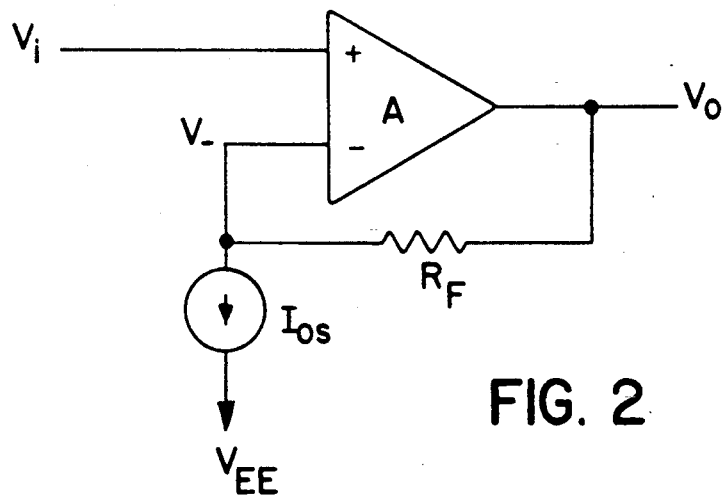
FIG. 2 is an equivalent DC circuit.

To understand how this is accomplished, consider the circuit 10 of FIG. 1. An ideal differential voltage amplifier and an open circuit load are assumed. First, the DC response alone will be determined. FIG. 2 shows the DC equivalent circuit. The network equations are:

$$V_o = A(V_i - V_-)$$

where Vi is a high-speed low DC signal and $V_-$ is a low-speed high DC level signal.

$$V_- = V_o - I_{os}R_F$$

where $I_{os}$ is a current source and $R_F$ is the feedback resistance. Therefore:

$$V_o = A[V_i - (V_o - I_{os}R_F)] = AV_i - AV_o + AI_{os}R_F$$
or
$$V_o(1 + A) = AV_i + AI_{os}R_F$$
$$V_o = [A/(1 + A)]V_i + [A/(1 + A)]I_{os}R_F$$

and as A gets very large:
$$V_o = V_i + I_{os}R_F$$

Since the voltage $I_{os}R_F$ can be large irrespective of the voltage level capability of Vi, the circuit can sum a high level DC offset with the fast signal Vi.

Figure 3A:
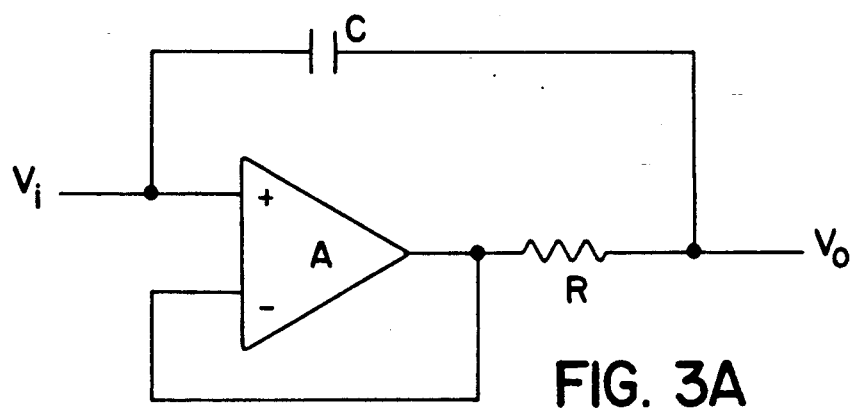
FIG. 3A is an equivalent AC circuit.
Figure 3B:
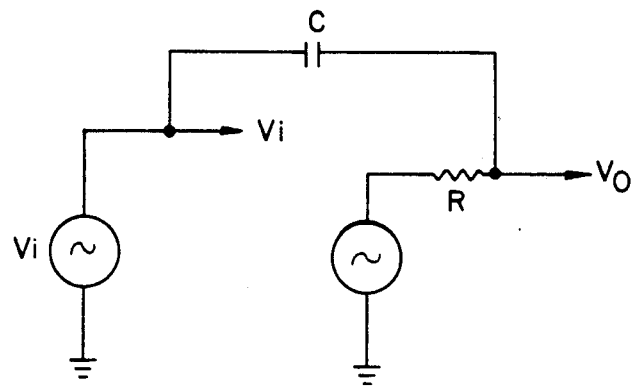
FIG. 3B is an ideal circuit equivalent of the circuit of FIG. 3A.
Figure 3C:
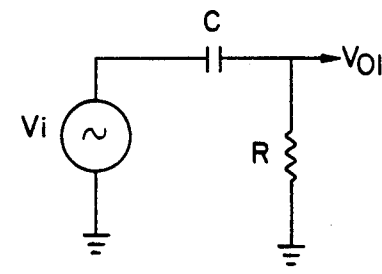
FIGS. 3C and 3D are simplified circuits for analysis of the circuit of FIG. 3B by superposition.
Figure 3D:
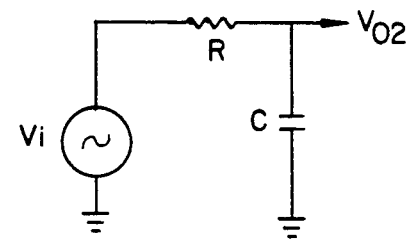

Next consider the circuits' AC operation. FIG. 3A shows the AC equivalent circuit. FIG. 3B is the equivalent based on the ideal amplifier assumption. By inspection of FIGS. 3C and 3D:

$$\frac{V_{o1}}{V_i} = \frac{s}{s + 1/RC}$$

$$\frac{V_{o2}}{V_i} = \frac{1/RC}{s + 1/RC}$$

$$\frac{V_{o1}}{V_i} + \frac{V_{o2}}{V_i} = \frac{V_o}{V_i} \text{ or } V_o/V_i = 1$$

This is the transfer function of the AC equivalent circuit.

This figure explains the origin of the crossover effect. Since the highpass and lowpass paths both have the same break frequency w = 1/RC, the overall transfer function is flat. One can also see that the characteristics of an ideal differential voltage amplifier are provided up to and including the crossover frequency; however those characteristics are not needed at the higher frequencies where low-DC-range-capable buffer amplifiers can operate. Well above the break frequency, the offset summer circuit has no effect other than gain reduction due to C's reactance, which eventually becomes inductive and large relative to the load. By adding high frequency capacitors in parallel to C, as required, this effect is made negligible. At frequencies much higher than the differential amplifiers' operating range, the uncontrolled output impedance of the differential amplifier is isolated from the load by the resistor R.

Figure 4:
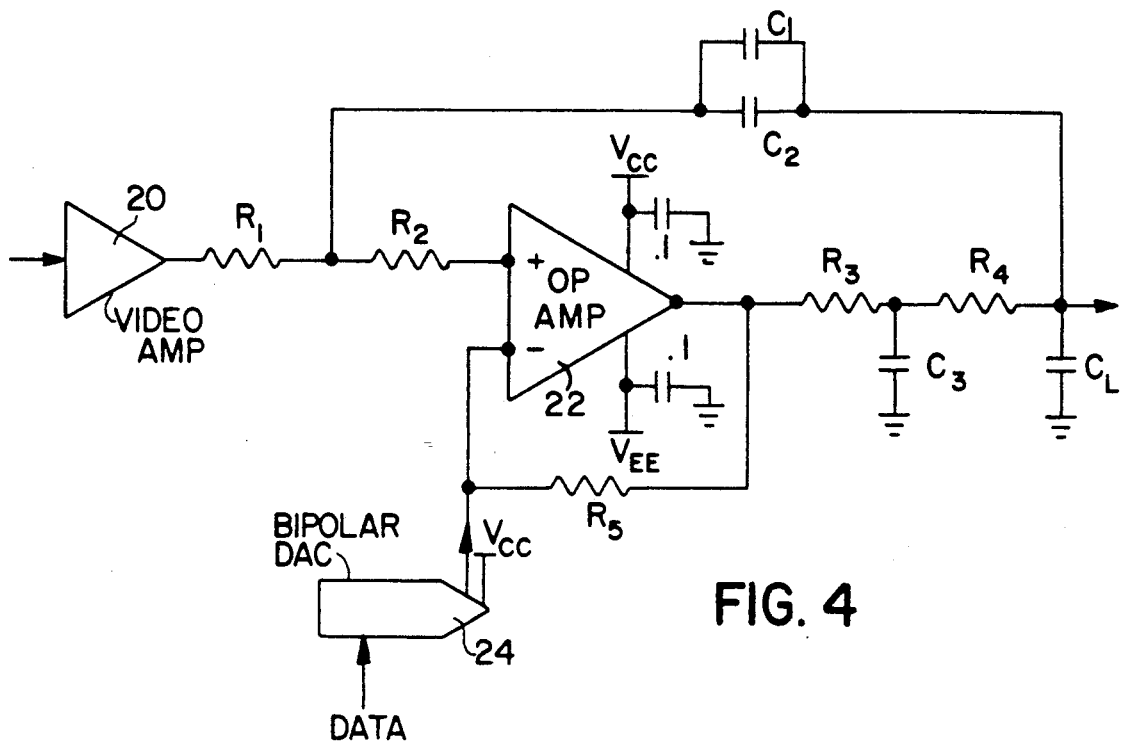
FIG. 4 is an electrical schematic diagram of the invention employed as a variable offset summer.

FIG. 4 shows one practical embodiment of a variable offset summer which incorporates the teachings of the present invention. FIG. 4 also includes some design considerations which follow in a straightforward manner from the topology. R1 reduces peaking of the video amp 20 caused by the capacitive load C1. R2 balances the op amp 22 input offset voltage component due to input bias current. R2 also isolates the input capacitance of the op amp 22 from the high speed video amplifier 20. This is useful when C1 is small. C3 filters the high frequency digital-to-analog converter 24 noise. A DAC-φ8 is a representative bipolar digital to analog converter 24.

Figure 5:
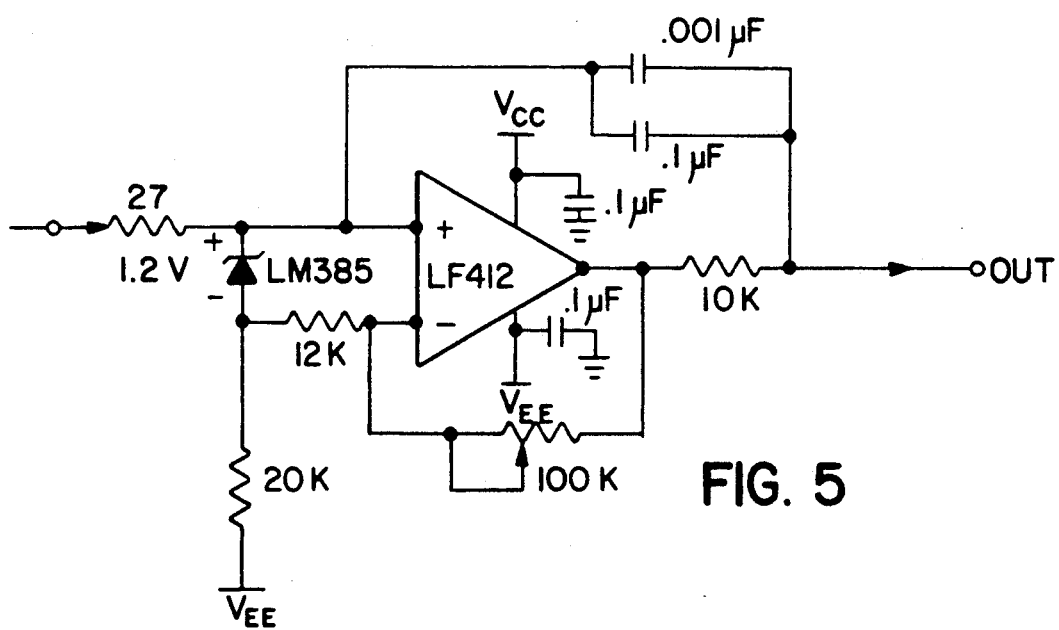
FIG. 5 is an electrical schematic diagram of the invention employed as a fixed offset summer.

FIG. 5 shows another embodiment of the invention when used as a fixed offset summer. This circuit has a 0 to +10 volt adjustment range and, in one test, showed DC to 70 MHz bandwidth in conjuction with a low power video amplifier, while driving a capacitive load of approximately 30 pF.

Figure 6:
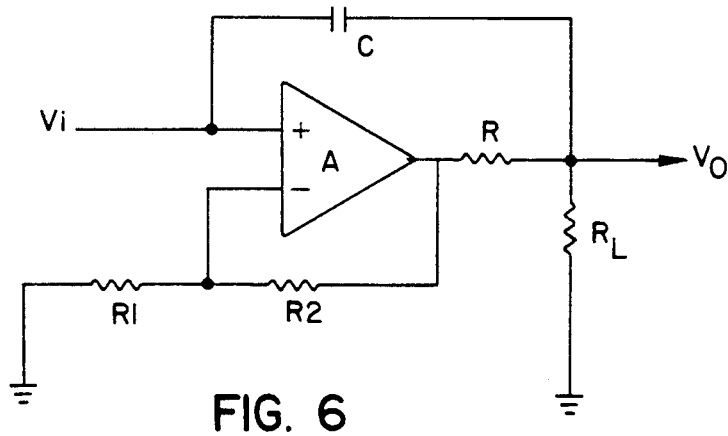
FIG. 6 is an electrical schematic diagram of the invention when used with a resistive load.
Figure 7A:
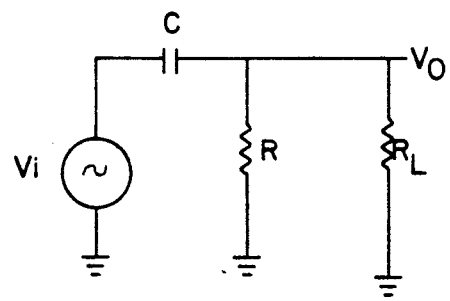
FIGS. 7A and 7B are equivalent AC circuits for the amplifier of FIG. 6

FIG. 6 shows a version of the circuit for use with resistive loads. The current source or sink connected to the inverting input of the amplifier provides the voltage offset. A summary AC analysis follows from FIGS. 7A and 7B. Specifically, from FIG. 7A:

$$R_p = \frac{RR_L}{R + R_L}$$

$$\frac{V_{o1}}{V_i} = \frac{s}{s + 1/R_pC}$$

Figure 7B:
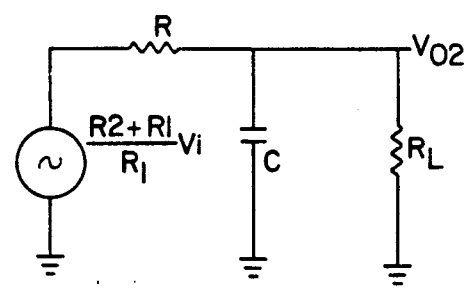

From FIG. 7B:

$$\frac{V_{o2}}{V_i} = \frac{(R_1 + R_2)}{R_1} \cdot \frac{1/RC}{s + 1/RC}$$

Since by choosing then $$\frac{1}{R_p} = \frac{R + R_L}{RR_L}$$

$$R_1 = R_L \text{ and } R_2 = R$$

$$\frac{V_{o2}}{V_i} = \frac{1/R_pC}{s + 1/R_pC}$$

and since $$\frac{V_o}{V_i} = \frac{V_{o1}}{V_i} + \frac{V_{o2}}{V_i}$$

then $$\frac{V_o}{V_i} = \frac{s + 1/R_pC}{s + 1/R_pC} = 1$$

This proves that frequency response can be made flat by selecting R2 and R1 for the gain to cancel the loss caused by the $R_L/R$ divider.

From the foregoing description, it will be observed that numerous variations, alternatives and modifications will be apparant to those skilled in the art. Accordingly, this description is to be construed as illustrative only and is for the purpose of teaching those skilled in the art the manner of carrying out the invention. Various changes may be made, materials substituted and separate features of the invention may be utilized. For example, although a monolithic differential amplifier was illustrated in the drawings, the principles of the invention are equally applicable to monolithic operational amplifiers, hybrid operational amplifiers and video amplifiers, current-feedback amplifiers, and discrete component implementations of a differential amplifier. Thus, it will be appreciated that various modifications, alternatives, variations, etc., may be made without departing from the spirit and scope of the invention as defined in the appended claims. It is, of course, intended to cover by the appended claims all such modifications which are within the scope of the claims.

We claim:

1. A high speed, low power DC-offsetting circuit, comprising:
   an amplifier having an inverting input, a non-inverting input which is adapted to be connected to a high speed low DC voltage source and having an amplifier output;
   a current source which is connected to said inverting input and through a feedback resistor to said amplifier output; and
   capacitor means and resistor means, connected in series with each other, for connecting said non-inverting input to said amplifier output, said resistor means having one end connected to said amplifier output and having an opposite end connected to a DC-offsetting circuit output which is formed at the connection between said capacitor means and said resistor means.

2. The circuit of claim 1, wherein said capacitor means comprises a plurality of capacitors, in parallel with each other, for maintaining capacitive reactance over the frequency range of said source.

3. The circuit of claim 1, wherein said high speed low DC voltage source is a video amplifier which is connected to said non-inverting input through two resistors which are in series with each other; and wherein said capacitor means is connected to said non-inverting input by connecting it to the connection between said two resistors which are connected at a common point to said capacitor means.

4. The circuit of claim 1, wherein said amplifier output is connected to a ground reference through a capacitive load.

5. The circuit of claim 4, wherein said resistor means comprises two resistors in series with each other at a node which is connected to a said ground reference through capacitive means.

6. The circuit of claim 1, wherein said current source comprises bipolar digital to analog converter means whose output is a current which is a function of a digital input signal.

7. The circuit of claim 1, wherein said feedback resistor is adjustable.

8. The circuit of claim 1, wherein said current source comprises: voltage reference means for establishing a predetermined voltage reference and for connecting said non-inverting input to said inverting input through a resistor and to a voltage source through another resistor.

9. The circuit of claim 8, wherein said voltage reference comprises LM385 means.

10. The circuit of claim 1, wherein said amplifier comprises LF412 means.

11. A variable offset summer, comprising:
   a) an amplifier having an inverting input, a non-inverting input which is adapted to be connected to a high speed low DC voltage source and having an amplifier output, wherein said non-inverting input is connected to a video amplifier source through two resistors which are in series with each other;
   b) bipolar digital to analog converter means whose output is a current which is a function of a data input signal and which is connected to said inverting input and through a feedback resistor to said amplifier output; and
   c) capacitor means and resistor means, connected in series with each other at a circuit output node, for connecting said non-inverting input to said amplifier output, said resistor means being connected to said amplifier output.

12. The circuit of claim 11, wherein said capacitor means comprises at least two capacitors in parallel with each other for maintaining capacitive reactance over the frequency range of said source.

13. The circuit of claim 11, wherein said resistor means comprising two resistors which are connected in a series with each other and to ground through one capacitive means; and wherein said circuit output node is connected to ground through second capacitive means.

14. A fixed offset summer, comprising:
   a) amplifier means having an inverting input, a non-inverting input which is adapted to be connected to a high speed low DC voltage source and having an amplifier output which is connected to said inverting input through a resistance;
   b) voltage reference means for establishing a predetermined voltage reference and for connecting said non-inverting input to said inverting input through a resistor and to a voltage source through another resistor; and
   c) capacitor means and resistor means, connected in series with each other at a circuit output node, for connecting said non-inverting input to said amplifier output, said resistor means being connected to said amplifier output.

15. The circuit of claim 14, wherein said amplifier means comprises LF412 means.

16. The circuit of claim 14, wherein said voltage reference means comprises LM385 means.

17. The circuit of claim 14, wherein said resistance is adjustable to achieve a DC offset over a predetermined range.

18. The circuit of claim 14, wherein said capacitor comprises two capacitors in parallel with each other.

19. A circuit comprising:
   a) a high gain amplifier means having a non-inverting input, an inverting input which is connected to a DC coupled low frequency signal and having an amplifier output which is connected to said inverting input through a resistance;
   b) an input terminal for receiving a high speed DC coupled signal; and
   c) circuit means connected to said input terminal and to said non-inverting input, for passing said high speed DC coupled signal through one path including said high gain amplifier to a circuit output terminal and carrying through said one path DC and relatively low frequency signals up to a predetermined break frequency and for passing said high speed DC coupled signal through a second path to said circuit output terminal and carrying through said second path relatively high frequency signals from said break frequency to a predetermined upper frequency limit.

20. The circuit of claim 19, wherein said circuit means comprises: capacitor means connected at one end to said input terminal and at an opposite end to said circuit output terminal; and resistor means, connected to said opposite end of said capacitor means and to said circuit output terminal, for connecting said circuit output to said amplifier output.

21. A circuit for the level translation of a video signal, comprising: an amplifier having a non-inverting input which is adapted to receive a video signal, having an inverting input which is connected via a current source or sink means to ground and which is connected by a first resistor to a ground reference, and having an amplifier output which is connected to said inverting input by a second resistor; and the equivalent of a capacitor which is connected at one end to said non-inverting input and which is connected at its other end to a resistive circuit load and to one end of a third resistor which is connected at its other end to said amplifier output.

* * * * *